United States Patent
Katayama

(10) Patent No.: US 8,848,943 B2
(45) Date of Patent: Sep. 30, 2014

(54) SIGNAL PROCESSING DEVICE, SIGNAL PROCESSING METHOD, AND SOUND EMITTING SYSTEM

(75) Inventor: Masaki Katayama, Hamamatsu (JP)

(73) Assignee: Yamaha Corporation, Hamamatsu-Shi, Shizuoka (JP)

( * ) Notice: Subject to any disclaimer, the term of this patent is extended or adjusted under 35 U.S.C. 154(b) by 714 days.

(21) Appl. No.: 12/551,988

(22) Filed: Sep. 1, 2009

(65) Prior Publication Data

US 2010/0067716 A1    Mar. 18, 2010

(30) Foreign Application Priority Data

Sep. 12, 2008 (JP) ................................. 2008-234832

(51) Int. Cl.
 *H03G 5/00*  (2006.01)
 *H03G 5/02*  (2006.01)
(52) U.S. Cl.
 CPC ..................................... *H03G 5/025* (2013.01)
 USPC ............. 381/99; 381/103; 381/102; 381/109; 381/97
(58) Field of Classification Search
 USPC ......... 381/118, 59, 22, 27, 28, 320, 321, 332, 381/333, 334, 94.2, 94.3, 94.4, 98, 99, 100, 381/101, 102, 103, 104, 109, 110, 111, 107, 381/120, 119, 93, 96, 83, 318, 108, 121; 84/665, 672, 673
 See application file for complete search history.

(56) References Cited

U.S. PATENT DOCUMENTS

| 4,426,552 A | * | 1/1984 | Cowans et al. | ............... 381/94.9 |
| 4,583,245 A | * | 4/1986 | Gelow et al. | .................... 381/59 |
| 7,016,509 B1 | * | 3/2006 | Bharitkar et al. | ............... 381/98 |

FOREIGN PATENT DOCUMENTS

| JP | 02043099 U | * | 3/1990 | .............. H04S 1/100 |
| JP | 2000-197182 A | | 7/2000 | |

OTHER PUBLICATIONS

Japanese Office Action dated Sep. 11, 2012 with partial translation (five (5) pages).
Microfilm of JP-UM No. S63-120910 (JP-UM-A No. H02-43099) with partial computer-generated translation (twelve (12) pages).
Microfilm of JP-UM No. H01-94540 (JP-UM-A No. H03-34394) with partial computer-generated translation (eleven (11) pages).

\* cited by examiner

*Primary Examiner* — Leshui Zhang
(74) *Attorney, Agent, or Firm* — Crowell & Moring LLP

(57) ABSTRACT

A signal processing device for supplying sound signals to a first speaker for emitting a sound on a low-pitched sound side and a second speaker for emitting a sound on a high-pitched sound side higher than the low-pitched sound side, includes a control portion that controls a characteristic of the sound signal supplied to the first speaker so that an output level of the first speaker is maintained at a crossover frequency between the first speaker and the second speaker, when an output level of the sound signal supplied to the first speaker is changed.

9 Claims, 5 Drawing Sheets

SIGNAL PROCESSING DEVICE, SIGNAL PROCESSING METHOD, AND SOUND EMITTING SYSTEM

BACKGROUND

The present invention relates to a signal processing device, a signal processing method and a sound emitting system for utilizing a subwoofer for emitting a sound on a low-pitched sound side and a speaker for emitting a sound on a high-pitched sound side higher than the subwoofer in combination to emit a sound.

Recently, it is done in the home theater, or the like that the frequency characteristics of the sound signals fed to respective speakers should be adjusted to reproduce a better sound. For example, in Patent Literature 1, such an approach is set forth that a balance between a mid-pitched sound and a low-pitched sound is adjusted by lowering a sound volume in the mid-pitched sound and shifting a cut-off frequency to the high-pitched sound side. However, such a problem arises that, when the sound volume in the mid-pitched sound is lowered, the low-pitched sound is emphasized and thus localization of sounds is changed or a feeling of localization is lacking. Therefore, in Patent Literature 1, the approach of restoring a feeling of localization of sounds to its original state by increasing a sound volume in a predetermined band (1 to 8 kHz) on the mid-pitched sound side is also set forth.
[Patent Literature 1] JP-A-2000-197182

Meanwhile, in order to compensate the low-pitched sound side that cannot be sufficiently reproduced by the ordinary speaker, in many cases the subwoofer for emitting exclusively the sound in the low-pitched sound side is added to the sound emitting system in the home theater, or the like. In many cases, the subwoofer is placed in the direction except the forward front direction when viewed from the listening position. A boundary (crossover frequency) of the frequency bands that are assigned to both speakers respectively is set between the subwoofer that emits the sound in the low-pitched sound side and the speaker that emits the sound the mid-pitched sound side. Normally, a crossover frequency is set depending on a low-pitched sound reproducing ability of the speaker that emits the sound in the mid-pitched sound side.

In the home theater, or the like, many users desire to emphasize the low-pitched sound much more, and thus a sound volume of the subwoofer is often increased relatively. When a sound volume of the subwoofer is increased, the subwoofer has charge of the sound emission up to the band in excess of a crossover frequency (mid-pitched sound side)(see a solid fine line in FIG. 2). Therefore, such a problem is caused that the localization of sounds is moved to the subwoofer side (the direction other than the forward front direction) or a feeling of localization is lacking.

Also, there exists such a problem that, when a sound volume of the subwoofer is increased, a sound quality is degraded (a strange feeling is produced in an auditory sense). That is, such a problem arises that, when only a sound volume of the subwoofer is increased, a balance of sound volume between the subwoofer and the speaker is lost in the band in excess of the crossover frequency.

In Patent Literature 1, merely the control of the cut-off frequency and the sound volume is applied to the mid-pitched sound side. Therefore, a balance of sound volume is still lost in the band that exceeds the crossover frequency or more. Namely, the problem caused due to a difference in a reproducing ability between the subwoofer and the speaker is not considered. It is still impossible to say that the problems of localization of sounds and degradation of sound quality are solved. Also, such a problem arises that, when only a certain band is emphasized as in Patent Literature 1, a balance of sound volume in the band in excess of the crossover frequency becomes worse furthermore.

SUMMARY

Therefore, it is an object of the present invention to provide a signal processing device, a signal processing method, and a sound emitting system capable of relieving the problems of localization of sounds and degradation of sound quality caused due to a difference in a reproducing ability between a subwoofer and a speaker.

In order to achieve the above object, according to the present invention, there is provided a signal processing device for supplying sound signals to a first speaker for emitting a sound on a low-pitched sound side and a second speaker for emitting a sound on a high-pitched sound side higher than the low-pitched sound side, comprising:

a control portion that controls a characteristic of the sound signal supplied to the first speaker so that an output level of the first speaker is maintained at a crossover frequency between the first speaker and the second speaker, when an output level of the sound signal supplied to the first speaker is changed.

Preferably, the control portion shifts a cut-off frequency of a filter portion for the first speaker to the low-pitched sound side or the high-pitched sound side in response to an amount of change of the output level of the sound signal that is supplied to the first speaker.

Preferably, the control portion controls an amount of shift of the cut-off frequency so that the output level of the first speaker is maintained in a frequency band higher than the crossover frequency.

Preferably, the control portion changes a filter order of a filter portion for the first speaker to high or low in response to an amount of change of the output level of the sound signal that is supplied to the first speaker.

According to the present invention, there is also provided a signal processing method, comprising:

supplying a sound signal to a first speaker for emitting a sound on a low-pitched sound side;

supplying a sound signal to a second speaker for emitting a sound on a high-pitched sound side higher than the low-pitched sound side; and controlling a characteristic of the sound signal supplied to the first speaker so that an output level of the first speaker is maintained at a crossover frequency between the first speaker and the second speaker, when an output level of the sound signal supplied to the first speaker is changed.

Preferably, in the controlling process, a cut-off frequency of a filter portion for the first speaker is shifted to the low-pitched sound side or the high-pitched sound side in response to an amount of change of the output level of the sound signal that is supplied to the first speaker.

Preferably, in the controlling process, an amount of shift of the cut-off frequency is controlled so that the output level of the first speaker is maintained in a frequency band higher than the crossover frequency.

Preferably, in the controlling process, a filter order of a filter portion for the first speaker is changed to high or low in response to an amount of change of the output level of the sound signal that is supplied to the first speaker.

According to the present invention, there is also provided a sound emitting system, comprising:

a first speaker that emits a sound on a low-pitched sound side;

a second speaker that emits a sound on a high-pitched sound side higher than the low-pitched sound side; and a signal processing portion that supplies sound signals to the first speaker and the second speaker;

wherein, when an output level of the sound signal supplied to the first speaker is changed, the signal processing portion controls a characteristic of the sound signal supplied to the first speaker so that an output level of the first speaker is maintained at a crossover frequency between the first speaker and the second speaker.

Preferably, the signal processing portion shifts a cut-off frequency of a filter portion for the first speaker to the low-pitched sound side or the high-pitched sound side in response to an amount of change of the output level of the sound signal that is supplied to the first speaker.

Preferably, the signal processing portion controls an amount of shift of the cut-off frequency so that the output level of the first speaker is maintained in a frequency band higher than the crossover frequency.

Preferably, the signal processing portion changes a filter order of a filter portion for the first speaker to high or low in response to an amount of change of the output level of the sound signal that is supplied to the first speaker.

For example, when a sound volume of the first speaker is increased, the order of low-pass filters is increased and the output level of the first speaker is decreased around the crossover frequency.

Also, for example, when a sound volume of the first speaker is increased, the cut-off frequency of the filter portion for the first speaker is shifted to the low-pitched sound side. Therefore, the output level of the first speaker around the crossover frequency can be maintained, and thus a feeling of localization of sounds can be maintained while enhancing the low-pitched sound.

Also, for example, when the crossover frequency is 150 Hz and the order of low-pass filters is the two, the cut-off frequency is set to 75 Hz after the output level is increased by 12 dB. In this case, the output level of the first speaker in the frequency band of the high-pitched sound side (e.g., 300 Hz or more, or the like) higher than the crossover frequency coincides with that obtained before the output level is increased. In this manner, a balance of sound volume between the first speaker and the second speaker on the high-pitched sound side higher the crossover frequency can be maintained, and thus a sound quality on the mid-pitched sound side can be maintained while enhancing the low-pitched sound side.

According to the present invention, the problems of the localization of sounds and the degradation of sound quality caused due to a difference in a reproducing ability between the first speaker and the second speaker can be relieved.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Figure 1:
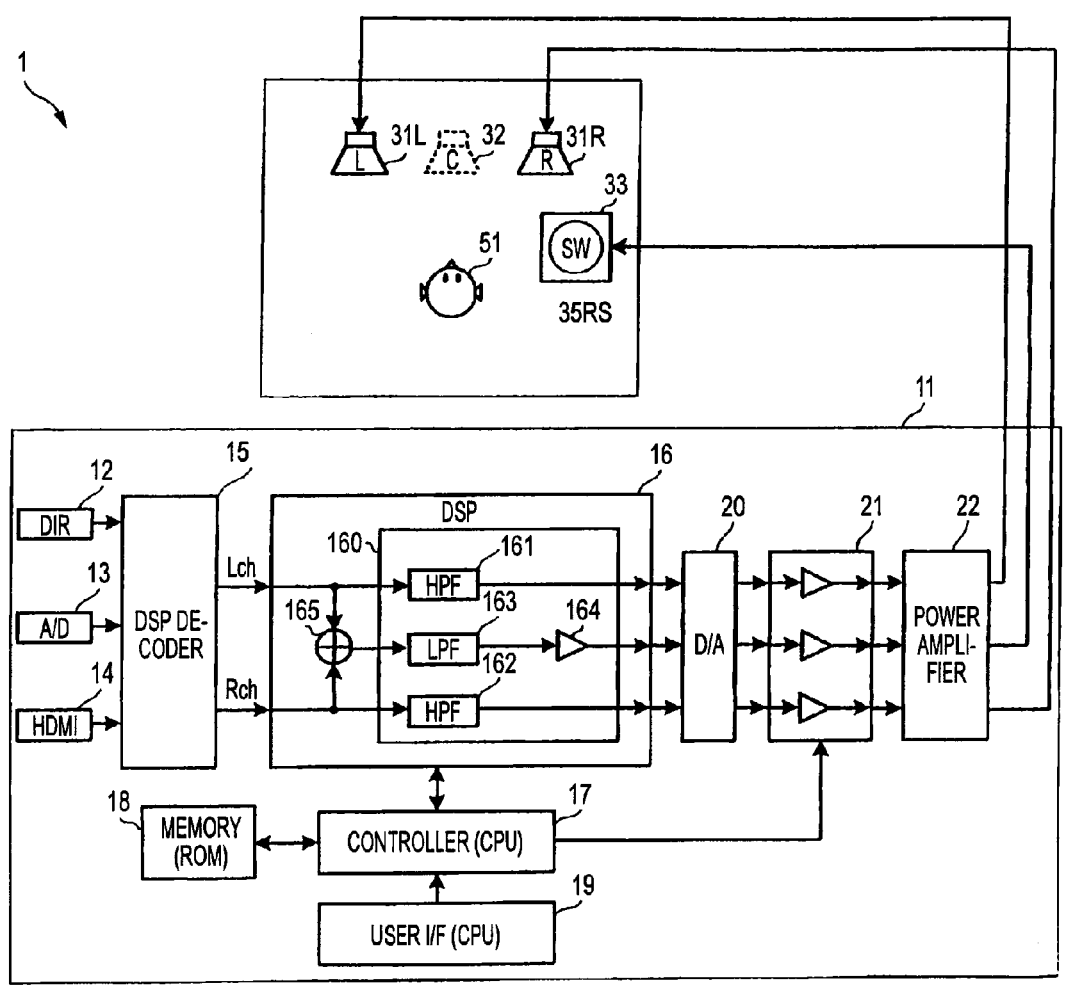
FIG. 1 is a view showing a configuration of a sound emitting system according to an embodiment of the present invention.

FIG. 1 is a view showing a configuration of a sound emitting system according to an embodiment of the present invention. A sound emitting system 1 includes an amplifier 11, a speaker 31L, a speaker 31R, and a subwoofer 33. The amplifier 11 corresponds to a signal processing portion of the present invention.

The speaker 31L is placed on the left side when viewed from a listening position 51, and the speaker 31R is placed on the right side when viewed from the listening position 51. The subwoofer 33 is placed in any front place (e.g., the further right side of the speaker 31R) when viewed from the listening position 51. Commonly, the subwoofer has a larger enclosure than the speaker. Therefore, as shown in FIG. 1, the subwoofer is placed in the direction except the forward front of the listening position (in the non-obstructive position).

The amplifier 11 is connected to the speaker 31L, the speaker 31R, and the subwoofer 33, and supplies a sound signal to them.

The amplifier 11 has a DIR 12, an A/D converter 13, a HDMI (registered trademark) 14, a decoder (DSP decoder) 15, a DSP 16, a controller (CPU) 17, a memory (ROM) 18, a user I/F (CPU) 19, a D/A converter 20, a preamplifier 21, and a power amplifier 22.

The A/D converter 13 also acts as an input interface of an analog sound signal. The A/D converter 13 receives the analog sound signal from other equipment such as a DVD player, or the like, converts this analog sound signal into a digital sound signal, and outputs this digital sound signal to the decoder 15. The DIR 12 and the HDMI (registered trademark) 14 receive PCM data, etc. from other equipment, and input the data into the decoder 15.

The decoder 15 decodes the digital sound signals, the PCM data, etc., which are input from various interfaces of the DIR 12, the A/D converter 13, and the HDMI (registered trademark) 14, into digital sound signals on two channels (L channel, R channel), and outputs the decoded signals to the DSP 16.

The DSP 16 includes a filter portion 160 having a HPF 161, a HPF 162, an LPF 163, and an amplifier 164, and an adder 165. The HPF 161 receives the digital sound signal on the L channel, and the HPF 162 receives the digital sound signal on the R channel. The HPF 161 and the HPF 162 are a filter that limits a band below a predetermined frequency (low-pitched sound side), respectively. The digital sound signals on the L channel and the R channel undergo a band limitation from the HPF 161 and the HPF 162 to block a predetermined frequency or less, and are output to the D/A converter 20 and converted into the analog sound signal respectively. Then, the analog sound signal on the L channel is amplified by the preamplifier 21 and the power amplifier 22, and is supplied to the speaker 31L. Also, the analog sound signal on the R channel is amplified by the preamplifier 21 and the power amplifier 22, and is supplied to the speaker 31R.

The sound signal on a C channel is contained in both the analog sound signals on the L channel and the R channel. Accordingly, when these sound signals are output at the same level and then the sound is emitted from the speaker 31L and the speaker 31R respectively, a virtual sound source 32 on the C channel can be created on the front forward side when viewed from the listening position 51.

In contrast, in the DSP 16, the digital sound signals on the L channel and the R channel are input into the adder 165. The adder 165 adds these digital sound signals on the L channel and the R channel, and outputs the added signal to the LPF 163 as a digital sound signal for the subwoofer (referred to as a "subwoofer signal" hereinafter).

The LPF 163 is a filter that limits a band in excess of a predetermined frequency (high-pitched sound side) of the subwoofer signal being input from the adder 165 in accordance with the setting of the controller 17. The controller 17 reads an operation program from the memory 18, and controls a filter characteristic of the LPF 163. The subwoofer signal undergoes a limitation of the band in excess of a predetermined frequency by the LPF 163, then is output to the D/A converter 20 via the amplifier 164, and then is converted into the analog sound signal. Then, the analog sound signal for the subwoofer is amplified by the preamplifier 21 and the power amplifier 22, and is supplied to the subwoofer 33.

Also, the controller 17 receives an operation signal from the user I/F 19 based on the user's operation, and controls respective constituent portions. For example, when a sound volume adjusting operation is performed by the user I/F 19, the controller 17 outputs the control signal to the preamplifier 21 in response to this operation, and changes an amplification level of the sound signal. Also, when the user executes a sound volume adjusting operation of the subwoofer 33, the controller 17 changes an output level of the subwoofer signal in the amplifier 164 of the filter portion 160, and changes an output level of the subwoofer 33.

When the user executes the operation to increase (or decrease) a sound volume of the subwoofer 33, the signal processing portion of the sound emitting system changes a filter characteristic of the LPF 163 in response to a level of change of the output level of the subwoofer signal, and keeps an output level of the subwoofer 33 around the crossover frequency. Here, the "crossover frequency" mentioned in the present embodiment signifies a frequency that is set previously in answer to low-pitched sound reproducing abilities of the speaker 31L and the speaker 31R, and corresponds to a cut-off frequency of the HPF 161 and the HPF 162 (frequency at which a gain of the filter becomes −3 dB).

Figure 2:
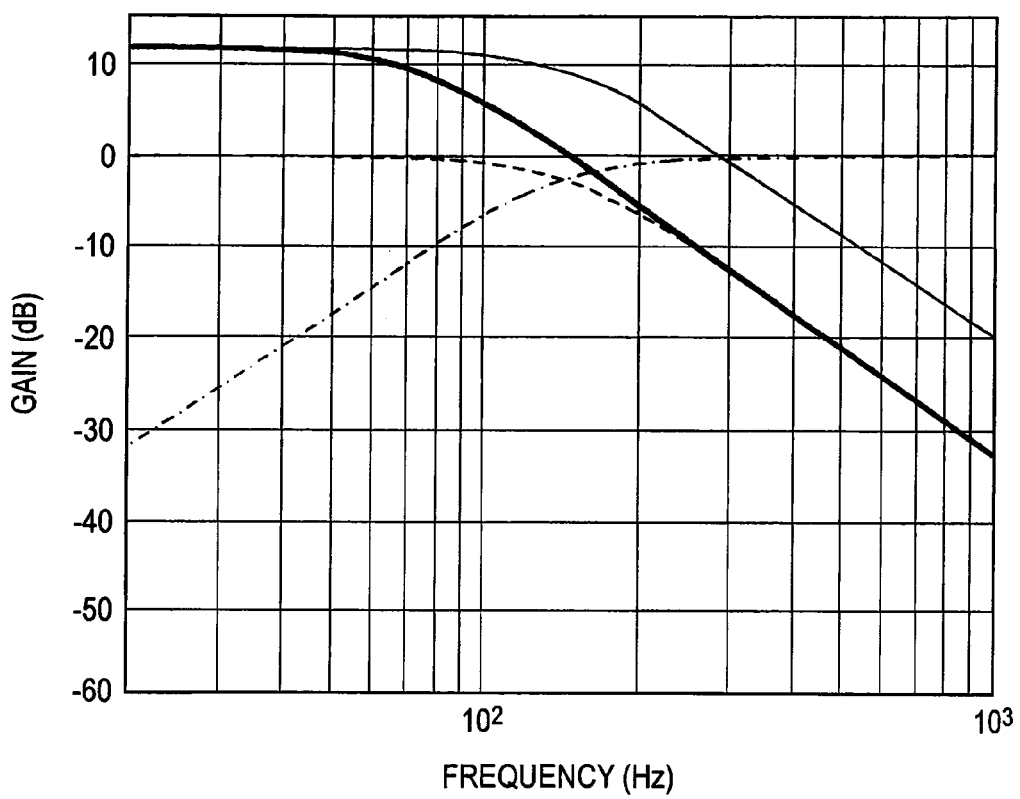
FIG. 2 is a view showing a frequency characteristic of a subwoofer signal.

Next, an adjusting mode of the subwoofer signal in the amplifier 11 will be explained hereunder. FIG. 2 is a view showing a frequency characteristic of the subwoofer signal in the filter portion 160. In a graph shown in FIG. 2, an abscissa denotes a frequency (Hz) and an ordinate denotes a gain.

A dot-dash line shown in FIG. 2 indicates frequency characteristics of the HPF 161 and the HPF 162 respectively, and indicates characteristics of output levels of the speaker 31L and the speaker 31R respectively. A broken line shown in FIG. 2 indicates frequency characteristics of the LPF 163 and the amplifier 164 respectively, and indicates a characteristic of an output level of the subwoofer 33.

In this example, the crossover frequency of the speaker and the subwoofer is set to 150 Hz. That is, a cut-off frequency of the HPF 161 and the HPF 162 is set to 150 Hz, and a cut-off frequency of the LPF 163 is also set to 150 Hz.

Here, an adjusting mode of the output level of the subwoofer taken when the user executes the operation to increase a sound volume of the subwoofer will be explained hereunder. When the user executes the operation to increase a sound volume of the subwoofer by 12 dB, the controller 17 increases a gain of the amplifier 164 by 12 dB. Then, as indicated with a solid fine line shown in FIG. 2, the output level of the subwoofer is increased over a full band range by 12 dB. Therefore, a difference in output level between the subwoofer and the speaker becomes 12 dB at 150 Hz as the crossover frequency.

At this time, the controller 17 causes a cut-off frequency of the LPF 163 to shift to the low-pitched sound side. The shifted cut-off frequency is decided by Formula 1 given as follows using the crossover frequency, an amount of change of the output level, and the order of filters, for example.

$$\text{cut-off frequency} = \frac{\text{crossover frequency}}{10^{\frac{\text{amount of change of output level}}{\text{order of filters} \times 20}}} \quad \text{[Formula 1]}$$

In this example, since the crossover frequency is 150 Hz and an amount of level change is 12 dB, the cut-off frequency is given by about 75 Hz when the order of filters is assumed as two. Therefore, the controller 17 set the cut-off frequency of the LPF 163 to about 75 Hz when a gain of the amplifier 164 is increased by 12 dB. When the cut-off frequency is set to about 75 Hz, the output level of the subwoofer has the frequency characteristic indicated with a solid thick line shown in FIG. 2. In this case, the output level around 150 Hz as the crossover frequency is seldom changed from that before a sound volume of the subwoofer is increased (at a time of the gain 0 dB). In particular, the output level on the high-pitched sound side rather than the crossover frequency coincides with that before a sound volume of the subwoofer is increased.

Figure 3:
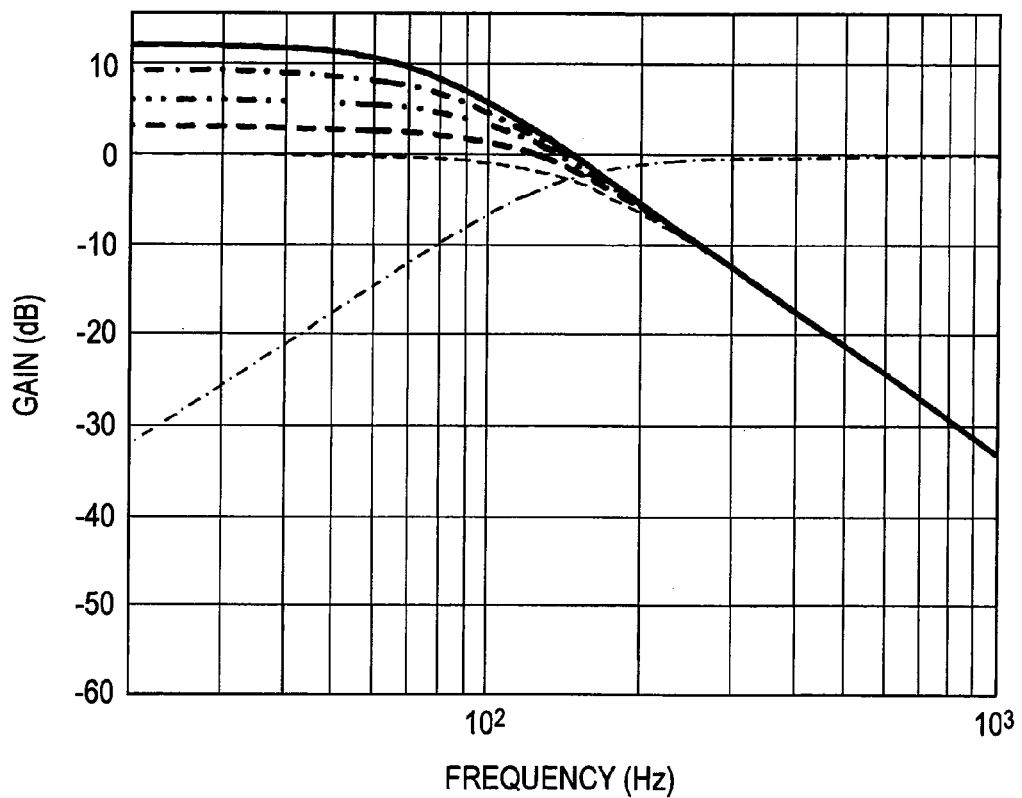
FIG. 3 is a view showing the frequency characteristic after a cut-off frequency is shifted when an output level of a subwoofer is increased to 3 dB, 6 dB, 9 dB, 12 dB respectively.

In FIG. 3, the frequency characteristic after the cut-off frequency is shifted when an output level of the subwoofer is increased to 3 dB, 6 dB, 9 dB, 12 dB respectively is shown. The controller 17 executes a calculation based on Formula 1 in response to an amount of change of the output level of the subwoofer, and sets the cut-off frequency. For example, the cut-off frequency is set to about 126 Hz when the output level of the subwoofer is increased by 3 dB, the cut-off frequency is set to about 106 Hz when the output level of the subwoofer is increased by 6 dB, and the cut-off frequency is set to about 90 Hz when the output level of the subwoofer is increased by 9 dB.

In any event, as shown in FIG. 3, the output level of the subwoofer at the crossover frequency is hardly changed from that obtained before a sound volume of the subwoofer is increased when the cut-off frequency is set as above. In all cases, the output level on the high-pitched sound side rather than the crossover frequency, e.g., 300 Hz or more, coincides with that obtained before a sound volume of the subwoofer is increased.

In this manner, the sound emitting system keeps the output level of the subwoofer at the crossover frequency even when the user executes the operation to increase a sound volume of the subwoofer, and can prevent such a phenomenon that the localization of sounds is moved to the subwoofer side or a feeling of localization is lacking. Also, since the output level in the band of the mid-pitched sound side, e.g., 300 Hz or more, substantially coincides with that obtained before a sound volume of the subwoofer is increased, a balance of the sound volume between the subwoofer and the speaker can be maintained, and also degradation of a sound quality can be reduced. Further, since the output level of the subwoofer at the crossover frequency is lowered, a margin of the clip can be increased.

In this case, when the output level of the subwoofer should be lowered, the cut-off frequency may be shifted to the high-pitched sound side. Such a possibility is small that the problem of a feeling of localization arises when the output level of the subwoofer is lowered. Nevertheless, a balance of the sound volume between the subwoofer on the mid-pitched sound side and the speaker is lost unless the cut-off frequency is changed, so that the problem of degradation of a sound quality is still caused. As a result, like the sound emitting system of the present embodiment, when a balance of the sound volume between the subwoofer and the speaker is maintained by shifting the cut-off frequency to the high-pitched sound side in response to a reduction of the output level of the subwoofer, the problem of degradation of a sound quality can be relieved.

In the above example, a mode in which the output level of the subwoofer is changed by the amplifier 164 in the DSP 16 is employed. But the output level of the subwoofer may be changed by changing an amount of amplification of the analog sound signal in the preamplifier 21. In this case, the cut-off frequency may be set in response to an amount of amplification of the analog sound signal in the preamplifier 21.

Figure 4:
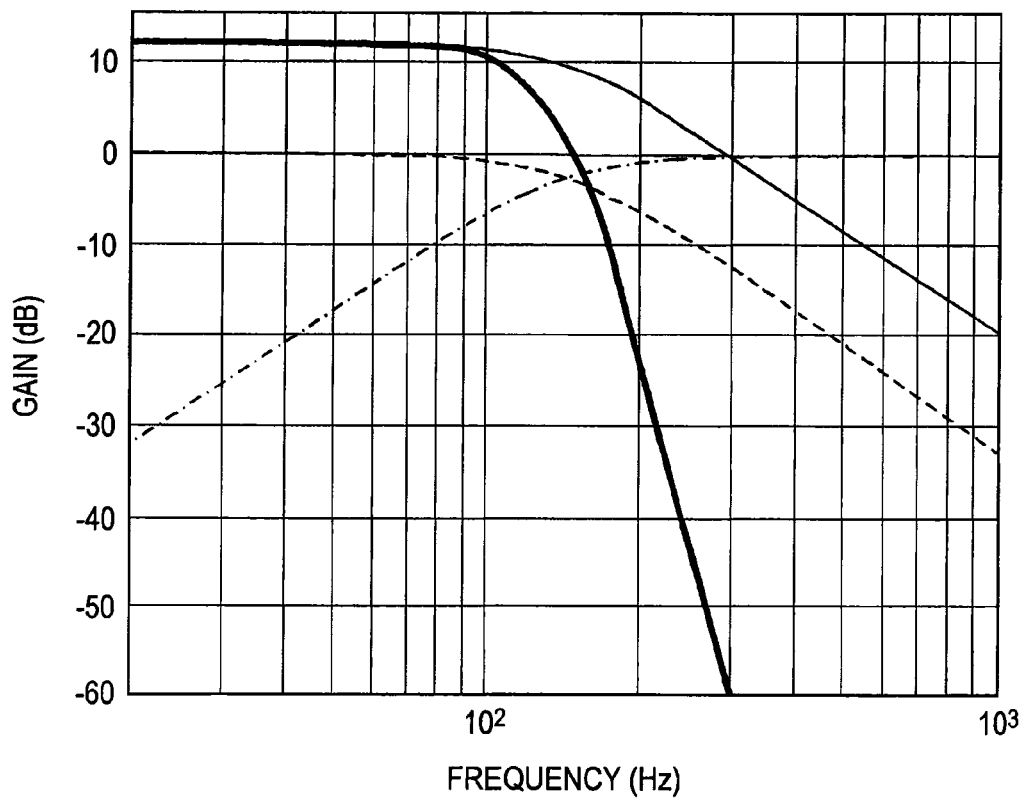
FIG. 4 is a view showing a characteristic of an output level of a subwoofer when a order of filters is changed.

In the above example, an example in which the output level of the subwoofer at the cut-off frequency is maintained by shifting the cut-off frequency is illustrated. But the output level of the subwoofer at the cut-off frequency may be maintained by changing the order of filters of the LPF 163. FIG. 4 is a view showing a characteristic of the output level of the subwoofer when the order of filters of the LPF is changed.

When the order of filters of the LPF 163 is increased, a gradient of attenuation is also sharpened, as indicated with a solid thick line shown in FIG. 4. Therefore, even when the output level of the subwoofer is increased, a difference in the output level at the cut-off frequency becomes small. In this case, such a phenomenon can also be prevented that the localization of sounds is moved to the subwoofer side or a feeling of localization is lacking. Here, the shifting of the cut-off frequency and the change of the order of filters may be applied simultaneously. That is, such a mode can be employed that the cut-off frequency is shifted to the low-pitched sound side while increasing the order of filters.

Figure 5:
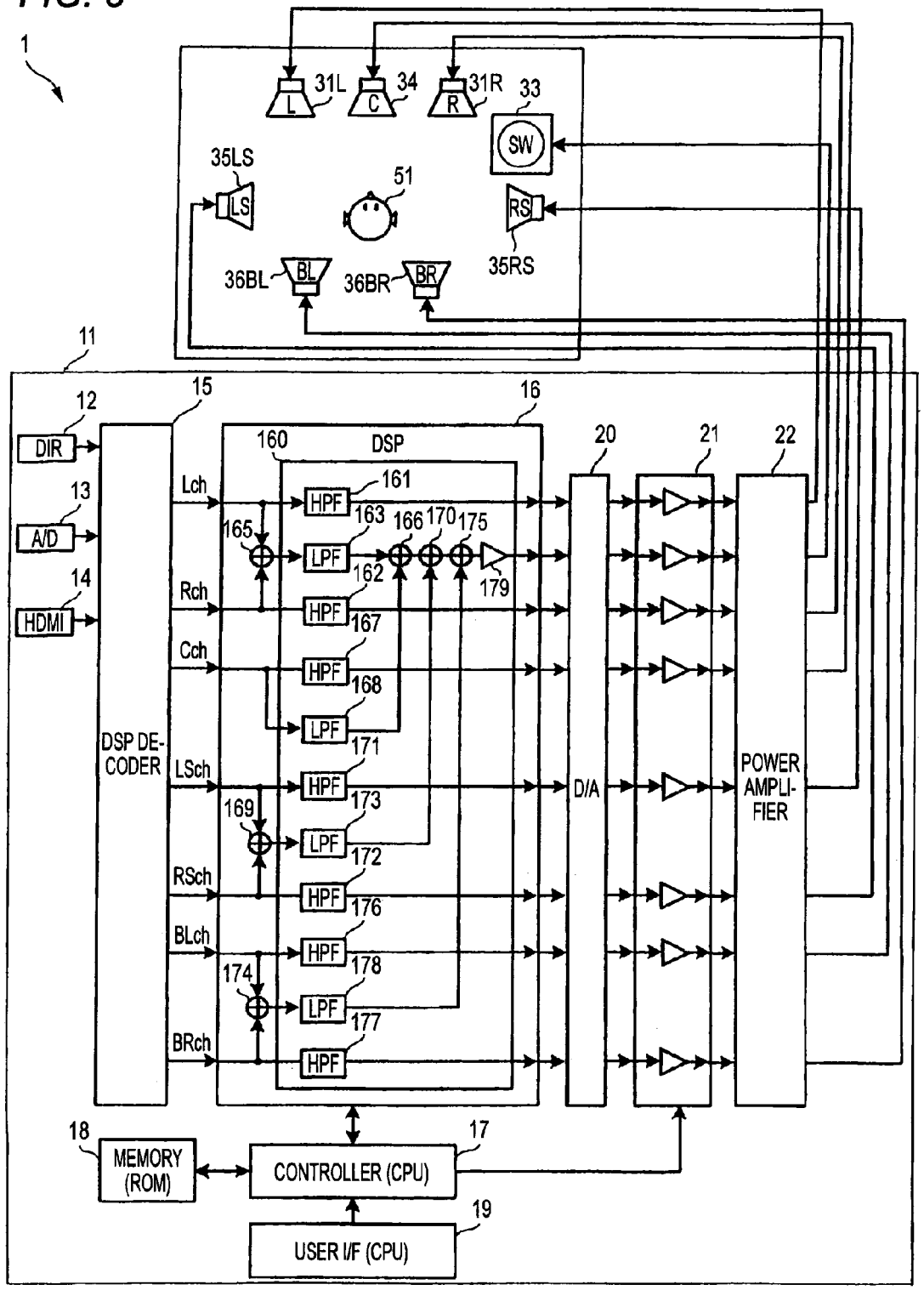
FIG. 5 is a view showing a configuration of a sound emitting system when a speaker 31C on a center channel is added.

Also, the number of channels of the speakers and the sound signals in the present invention is not limited to the example shown in FIG. 4. For example, even when the number of 3.1 channels, 5.1 channels, 7.1 channels, or more is employed, the configuration of the present invention can be applied similarly. In the above example, the reproducing abilities of the speaker 31L on the L channel and the speaker 31R on the R channel on the low-pitched sound side are set equally. Therefore, the subwoofer signal is produced by adding the digital sound signals on the L channel and the R channel, and then the output level is adjusted by the filter portion 160. In this case, when the speakers whose reproducing abilities on the low-pitched sound side are different are present, the filtering process is executed individually. For example, as a configuration of 7.1 channels, a configuration of a sound emitting system in which a speaker 31C on the center (C) channel, a speaker 35LS on a left surround (LS) channel, a speaker 35RS on a right surround (RS) channel, a speaker 36BL on a left back (BL) channel, and a speaker 36BR on a right back (BR) channel are added is shown in FIG. 5. In FIG. 5, the same reference symbols are affixed the same constituent elements as those shown in FIG. 1, and their explanation will be omitted herein.

In the example in FIG. 5, the decoder 15 outputs the digital sound signals on seven channels (L channel, R channel, C channel, LS channel, RS channel, BL channel, BR channel) to the DSP 16.

The DSP 16 shown in FIG. 5 includes the filter portion 160 having an adder 166, a HPF 167, an LPF 168, an adder 170, a HPF 171, a HPF 172, an LPF 173, an adder 175, a HPF 176, a HPF 177, an LPF 178, and an amplifier 179, an adder 169, and an adder 174, in addition to a configuration of the example in FIG. 1. The HPF 167 receives the digital sound signal on the C channel. The digital sound signal on the C channel undergoes a limitation of the band below a predetermined frequency by the HPF167, then the resultant signal is output to the D/A converter 20 and converted into the analog sound signal. Then, the analog sound signal on the C channel is amplified by the preamplifier 21 and the power amplifier 22, and then the amplified signal is supplied to the speaker 31C.

Meanwhile, the digital sound signal on the C channel is also input into the LPF 168. The LPF168 is such a filter that limits the band of the digital sound signal on the C channel in excess of the predetermined frequency (high-pitched sound side) in compliance with the setting of the controller 17. The digital sound signal that undergoes a limitation of the band in excess of the predetermined frequency by the LPF168 is input into the adder 166. The adder 166 adds the digital sound signal on the C channel, which is output from the LPF 168, to the above subwoofer signal, and outputs the added signal to the adder 170. The adder 170 adds the digital sound signal that the LPF 173 outputs, and outputs the added signal to the adder 175. Also, the adder 175 adds the digital sound signal that the LPF 178 outputs, and outputs the added signal to the amplifier 179. The amplifier 179 amplifies the input digital sound signal, and outputs the amplified signal to the D/A converter 20.

In this manner, the digital sound signal in which the signals on all channels are added is converted into the analog sound signal by the D/A converter 20, then is amplified by the preamplifier 21 and the power amplifier 22, and then is supplied to the subwoofer 33.

Here, the cut-off frequency of the HPF 167, i.e., the crossover frequency of the speaker 31C and the subwoofer 33, is set in response to the low-pitched sound reproducing ability of the speaker 31C. For example, when the low-pitched sound reproducing ability of the speaker 31C is lower than those of the speaker 31L and the speaker 31R, the crossover frequency is set to 200 Hz. In this case, the controller 17 also shifts the cut-off frequency of the HPF 168 in response to an amount of change of the output level of the subwoofer 33. When the crossover frequency is 200 Hz, an amount of level change is 12 dB, and the order of filters is two, the controller 17 sets the cut-off frequency to about 100 Hz.

Similarly, the digital sound signal on the LS channel is input into the HPF 171, and the digital sound signal on the RS channel is input into the HPF 172. Both digital sound signals on the LS channel and the RS channel are added by the adder 169, and then the added signal is input into the LPF 173. Also, the cut-off frequencies of the HPF 171 and the HPF 172 are set in response to the low-pitched sound reproducing abilities of the speaker 35RS and the speaker 35LS (for example, the cut-off frequencies are set to 250 Hz).

In this case, the controller 17 also shifts the cut-off frequency of the LPF 173 in response to an amount of change of the output level of the subwoofer. For example, when the crossover frequency is 250 Hz, an amount of level change is 12 dB, and the order of filters is two, the controller 17 sets the cut-off frequency to about 125 Hz.

Similarly, the digital sound signal on the BL channel is input into the HPF 176, and the digital sound signal on the BR channel is input into the HPF 177. Both digital sound signals on the BL channel and the BR channel are added by the adder 174, and then the added signal is input into the LPF 178. Also, the cut-off frequencies of the HPF 176 and the HPF 177 are set in response to the low-pitched sound reproducing abilities of the speaker 36BL and the speaker 36BR (for example, the cut-off frequencies are set to 220 Hz). The controller 17 shifts the cut-off frequency of the LPF 178 in response to an amount of change of the output level of the subwoofer. For example, when the crossover frequency is 220 Hz, an amount of level change is 12 dB, and the order of filters is two, the controller 17 sets the cut-off frequency to about 110 Hz.

In the above example, when a plurality of speakers having the same low-pitched sound reproducing ability respectively are present, the subwoofer signal is produced by adding the digital sound signals supplied to these speakers, and the cut-off frequency is adjusted by one LPF. In this event, the cut-off frequency may be adjusted individually on a speaker basis.

In this manner, according to the sound emitting system of the present embodiment, the output level of the subwoofer at the crossover frequency can be maintained substantially regardless of the number of speakers and sound signal channels, and such a phenomenon can be prevented that the localization of sounds is moved to the subwoofer side or a feeling of localization is lacking.

Here, in the present embodiment, an example in which the cut-off frequency is changed by the digital process using DSP is illustrated. But of course the cut-off frequency can be changed by the analog process.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2008-234832 filed on Sep. 12, 2008, the contents of which are incorporated herein for reference.

What is claimed is:

1. A signal processing device for supplying sound signals to a first speaker for emitting a sound on a low-pitched sound side and a second speaker for emitting a sound on a high-pitched sound side higher than the low-pitched sound side, comprising:
   a volume portion that changes a gain of an output level of a sound signal supplied to the first speaker; and
   a control portion that includes a low pass filter which changes a characteristic of the sound signal supplied to the first speaker; and
   wherein an output level of the sound signal supplied to the first speaker, as determined by a user operation of the volume portion, is maintained at a crossover frequency between the first speaker and the second speaker by changing a filter order of the low pass filter based on the gain of the output level of the sound signal supplied to the first speaker being changed by the user operation of the volume portion, and wherein the crossover frequency between the first speaker and the second speaker is fixed.

2. The signal processing device according to claim 1, wherein the control portion shifts a cut-off frequency of a filter portion for the first speaker to the low-pitched sound side or the high-pitched sound side in response to an amount of change of the output level of the sound signal that is supplied to the first speaker.

3. The signal processing device according to claim 2, wherein the control portion controls an amount of shift of the cut-off frequency so that the output level of the first speaker is maintained in a frequency band higher than the crossover frequency.

4. A signal processing method, comprising:
   supplying a sound signal to a first speaker for emitting a sound on a low-pitched sound side;
   supplying a sound signal to a second speaker for emitting a sound on a high-pitched sound side higher than the low-pitched sound side;
   changing a gain of an output of the sound signal supplied to the first speaker;
   changing, by a low pass filter, a characteristic of the sound signal supplied to the first speaker;
   maintaining an output level of the sound signal supplied to the first speaker at a crossover frequency between the first speaker and the second speaker by changing a filter order of the low pass filter based on the gain of the output level of the sound signal supplied to the first speaker being changed by a user operation of the volume portion, and wherein the crossover frequency between the first speaker and the second speaker is fixed.

5. The signal processing method according to claim 4, wherein a cut-off frequency of a filter portion for the first speaker is shifted to the low-pitched sound side or the high-pitched sound side in response to an amount of change of the output level of the sound signal that is supplied to the first speaker.

6. The signal processing method according to claim 5, wherein an amount of shift of the cut-off frequency is controlled so that the output level of the first speaker is maintained in a frequency band higher than the crossover frequency.

7. A sound emitting system, comprising:
   a first speaker that emits a sound on a low-pitched sound side;
   a second speaker that emits a sound on a high-pitched sound side higher than the low-pitched sound side;
   a signal processing portion that includes a low pass filter and the signal processing portion supplies sound signals to the first speaker and the second speaker; and
   a volume portion that changes a gain of an output level of the sound signal supplied to the first speaker;
   wherein, based on the gain of the output level of the sound signal supplied to the first speaker being changed by a user operation of the volume portion, the signal processing portion changes a characteristic of the sound signal supplied to the first speaker, and an output level of the sound signal supplied to the first speaker, as determined by the user operation of the volume portion, is maintained at a crossover frequency between the first speaker and the second speaker by changing a filter order of the low pass filter, wherein the crossover frequency between the first speaker and the second speaker is fixed.

8. The sound emitting system according to claim 7, wherein the signal processing portion shifts a cut-off frequency of a filter portion for the first speaker to the low-pitched sound side or the high-pitched sound side in response to an amount of change of the output level of the sound signal that is supplied to the first speaker.

9. The sound emitting system according to claim 8, wherein the signal processing portion controls an amount of shift of the cut-off frequency so that the output level of the first speaker is maintained in a frequency band higher than the crossover frequency.

* * * * *